United States Patent [19]

Takahashi et al.

[11] Patent Number: 5,573,861
[45] Date of Patent: Nov. 12, 1996

[54] HIGH PURITY ALUMINUM CONDUCTOR USED AT ULTRA LOW TEMPERATURE

[75] Inventors: Akihiko Takahashi, Ryugasaki; Hitoshi Yasuda, Tsukuba, both of Japan; Karl T. Hartwig, College Station, Tex.; Lacy C. McDonald, Bryan, Tex.; Hong Zou, College Station, Tex.

[73] Assignees: Sumitomo Chemical Co., Ltd., Osaka, Japan; The Texas A & M University Systems, College Station, Tex.

[21] Appl. No.: 88,032

[22] Filed: Jul. 6, 1993

[51] Int. Cl.$^6$ ............................ B32B 7/02; B32B 15/01
[52] U.S. Cl. .................... 428/621; 428/930; 335/216; 505/814; 174/125.1; 148/404
[58] Field of Search ................................ 148/404, 562; 420/528, 529, 531–534, 536, 537, 540–542, 546, 548, 549, 554; 156/DIG. 61; 174/125.1, 126.1; 428/930, 632, 651; 335/216; 505/812, 814

[56] References Cited

U.S. PATENT DOCUMENTS

| | | | |
|---|---|---|---|
| 3,211,547 | 10/1965 | Jarrett et al. | 156/DIG. 61 |
| 3,997,339 | 12/1976 | Fichelscher et al. | 420/528 |
| 4,166,755 | 9/1979 | Fister et al. | 420/529 |
| 4,213,800 | 7/1980 | Mayo et al. | 420/537 |
| 4,537,642 | 8/1985 | Saito et al. | 29/599 |
| 4,659,007 | 4/1987 | Onishi et al. | 29/599 |
| 4,711,825 | 12/1987 | Oberly et al. | |
| 4,976,792 | 12/1990 | Sawada | 148/404 |
| 5,189,386 | 2/1993 | Tada et al. | 428/651 |
| 5,266,416 | 11/1993 | Inoue et al. | 428/651 |
| 5,488,850 | 2/1996 | Hasegawa et al. | 72/253.1 |

FOREIGN PATENT DOCUMENTS 57-057856  4/1982  Japan .
59-056560  4/1984  Japan ...................... 420/528

OTHER PUBLICATIONS

Woldman's Engineering Alloys, 6th Ed. p. 1764 1979.
Metals Handbook, 9th Ed., vol. 15, pp. 319–323, 1988.
Superconducting Magnetic Energy Storage (SMES), vol. 1: Basic R&D 1984–1985, Section 4, Parts A & B, pp. 4–1 through 4–99, Electric Power Research Institute, Research Project 2572-2 (Final Report, Nov. 1990).
Database Inspec Institute of Electrical Engineers, Stevenage, GB, Inspec No. 1730206, Niculescu D et al., "Aluminum for cryoelectrotechnics", 1980, vol. 32, No. 9, ISSN 0039–3940, pp. 983–1002.

Primary Examiner—David A. Simmons
Assistant Examiner—Margery S. Phipps
Attorney, Agent, or Firm—Cushman Darby & Cushman, L.L.P.

[57] ABSTRACT

The aluminum conductor having increase of its electric resistivity kept small at ultra low temperature of 30° K. or lower even after cyclic strain is given at ultra low temperature, by controlling the crystal structure of the high purity aluminum conductor with purity of 99.9–99.9999 wt %. The crystal structure consist of (i) a veritable single or a substantially single crystal consisting of a bundle of sub-grains which have their crystal axes in the same direction or in the directions within a couple of degrees of deviation as a whole which has a specific crystal axis of <111> or <100> or the crystal axes close thereto in the longitudinal direction of the aluminum conductor, or (ii) a polycrystal most of which grains have respective specific crystal axes of <111> and/or <100>, or the crystal axes close thereto with respect to each grain in the longitudinal direction of the aluminum conductor, and have specific grain size of 0.01 mm to 3.0 mm.

9 Claims, No Drawings

HIGH PURITY ALUMINUM CONDUCTOR USED AT ULTRA LOW TEMPERATURE

FIELD OF THE INVENTION

This invention relates to a high purity aluminum conductor used at ultra low temperature of 30° K. or lower and its production process, the aluminum conductor being used under those conditions where cyclic strain is given at ultra low temperature.

TECHNICAL BACKGROUND AND PRIOR ART

In those facilities and equipment which utilize a superconductor, a conductor, generally called a cryostatic stabilizer, is provided on and around the superconductor to protect the superconductor by by-passing the electric current to the conductor when the state of superconductivity returns partly or completely to the state of normal conductivity due to external thermal, electric or magnetic disturbance. The transition from the state of superconductivity to the state of normal conductivity (usually called as "QUENCHING") is accompanied by $I^2R$ heat generation (wherein I means electric current and R means electric resistivity of the conductor) in the normal regions of the conductor where current flows.

High purity aluminum, because its electric resistivity is remarkably low at ultra low temperature and in magnetic field, has been discussed for possible use as such a cryostatic stabilizer. [F. R. Fickett, "Magneto-resistivity of Very Pure Polycrystalline Aluminum", Phy. Rev. B. Vol. 3, No. 6, 1971, p1941. "Superconducting Magnetic Energy Storage" Vol. 1: Basic R&D 1984–85, EPRI GS-7053, published by the Electric Power Research Institute in November 1990.]

The use of a cryostatic stabilizer made of high purity aluminum is planned for Superconducting Magnetic Energy Storage (SMES) devices. But in such facilities which store large quantities of electric power, hoop stresses are caused by the flow of current through the magnet, and when electric charging and discharging are repeated, cyclic tensile stress and compressive stress are given repeatedly to the superconductor and the cryostatic stabilizer.

It is known that such cyclic stress which includes a plastic strain component at ultra low temperature gives an adverse influence on high purity aluminum at ultra low temperature in the form of an increase in electric resistivity. [Advances in Cryogenic Engineering. 22, 486–489 (1976).]

Therefore, for those applications in which cyclic strain is given at ultra low temperature to the cryostatic stabilizer of high purity aluminum, the high purity aluminum conductor component ought to be of a relatively larger cross section in view of a possible increase in electric resistivity of the cryostatic stabilizer when in use, or the conductor should be so designed as to reduce plastic strain of the cryostatic stabilizer under the same stress by increasing the design strength of the structural materials of SMES.

However, the above countermeasures require a large amount of materials when adopted for such large structures as utility scale SMES and are therefore very costly.

Further, it is known in the report of the International Conference on Cryogenic Materials, Applications and Properties, Shenyang, People's Republic of China, Jun. 7–10, 1988 that in the case of a high purity aluminum conductor with the same purity as that of the high purity aluminum in the present invention used at ultra low temperature, its electric resistivity under cyclic strain does not remain low enough for the stabilizer if the cyclic strain range is too high.

SUMMARY DESCRIPTION OF THE INVENTION

An object of the present invention resides in providing a high purity aluminum conductor used at ultra low temperature with purity of 99.9 to 99.9999 weight %, preferably 99.99 to 99.9999 weight %, by which increase of its electric resistivity kept small under those conditions where cyclic strain is given at ultra low temperature. Herein, the words of ultra low temperature mean a temperature range of 30° K. or lower.

Another object of the present invention resides in providing a production process for the aluminum conductor.

The present inventors made thorough studies about the development of the high purity aluminum conductor by which increase in electric resistivity at ultra low temperature is kept small even after cyclic strain is given at ultra low temperature. As a result, the inventors have found that by controlling the crystal structure of the high purity aluminum conductor so as to consist of (i) a single crystal which has a specific crystal axis of <111> or <100>, or within an angle range of not greater than 10° in relation to the <111> or <100> axis in the longitudinal direction of the aluminum conductor, or (ii) a polycrystal most of which crystal grains have respective specific crystal axes, namely the <111> and/or <100> axes and/or the axes within an angle range of not greater than 10° in relation to the <111> or <100> axis, in the longitudinal direction of the aluminum conductor, and have specific crystal grain size, namely the mean crystal grain size is between 0.01 mm and 3.0 mm, the increase of electric resistivity of the aluminum conductor can be kept small at ultra low temperature even after longitudinal cyclic strain is given at ultra low temperature.

DETAILED DESCRIPTION OF THE INVENTION

The invention is applied to high purity aluminum with purity of 99.9 to 99.9999 weight %, preferably 99.99 to 99.9999 weight %. In the invention, the purity of high purity aluminum means weight percent obtained by deducting, from 100, the amount of metallic and semi-metallic elements contained in the aluminum other than aluminum element which are detected by, for example, GDMSS (Glow Discharge Mass Spectroscopy). Such gas components contained in the aluminum as oxygen, hydrogen or chlorine atoms are not deducted.

High purity aluminum with purity level of less than 99.9 weight % is inadequate as a cryostatic stabilizer for facilities such as SMES using superconductors, because, even at ultra low temperature, its electric resistivity is not low enough for the stabilizer.

A veritable single crystal can be produced by the method of strain anneal crystal growth. The Bridgemen method, Chalmers method or Czochralski method, which uses an oriented seed crystal, can be adopted for obtaining an aluminum conductor consisting of a substantially single crystal which has the <111> or <100> axis, or the crystal axes within an angle range of not greater than 10° in relation to the <111> or <100> axis in the longitudinal direction of the aluminum conductor. A very low speed particular continuous casting method can be adopted for obtaining an aluminum conductor consisting of the substantially single crystal.

A bundle type polycrystal made of a bundle of grains each of which is rather columnar and is almost as long as the length of the aluminum conductor in the longitudinal directions of the conductor has the same effects as those of the substantially single crystal, and has specific and effective orientation mentioned above. And the same low speed paticular continuous casting method can be adopted for obtaining such a bundle of polycrystal.

A polycrystal, consisting of very coarse crystal grains, each of which (i) is as long as the diameter of the aluminum conductor in the lateral direction of the conductor and (ii) is lined one after another in the longitudinal direction of the conductor, and most of which grains have the <111> and/or <100> axis and/or the crystal axes within an angle range of not greater than 10° in relation to the <111> or <100> axis, respectively, in the longitudinal direction of the conductor, can work in a manner similar to the single crystal mentioned above as a high purity aluminum conductor for use at ultra low temperature in this invention.

Further, an aluminum conductor consisting of a polycrystal, most of which crystal grains have the <111> and/or <100> axis and/or the crystal axes within an angle range of not greater than 10° in relation to the <111> or <100> axis, respectively, in the longitudinal direction of the aluminum conductor and have mean grain size between 0.01 mm and 3.0 mm, preferably 0.01 to 2.0 mm, also works effectively as a high purity aluminum used at ultra low temperature in this invention. An extrusion crystal texture or re-crystallized texture is suitable for such a polycrystal. In this invention, such extrusion crystal texture or re-crystallized texture can be obtained by extrusion working of high purity aluminum at 150° C. to 350° C. and in area reduction ratio of 1/10 to 1/150, preferably 1/20 to 1/100, optionally cooling it to room temperature, subsequently heating it up to a temperature range of from 250° C. to 530° C. and holding it at the temperature for 10 min. to 120 min.

As will be apparent from Tables 1 and 2 shown herein, after cyclic strain is given 3,000 times at ultra low temperature, the high purity aluminum of the invention has lower electric resistivity in liquid helium than the aluminum used in the comparative examples and, therefore, has excellent properties as a cryostatic stabilizer used at ultra low temperature.

EXAMPLE 1:

A high purity alminium rod with a purity of 99.999 weight % was extruded at 280° C. by a hot extrusion press (1,500 ton extrusion press of NIHON TEKKO) from an initial diameter of 155 mm to 25 mm. After the rod was cut to obtain a 210 mm long sample, the sample was heated rapidly to 450° C. and held at the temperature for 10 minutes. A 10 mm long piece was cut out from one end section of the 210 mm long sample, and the cut surface was machined and polished. After the polished surface layer of the piece was eliminated by chemical etching and it was confirmed that the sample consisted of a grain-form crystal, the <111> pole figure was measured by x-ray diffraction (Schulz Reflection Method). As a result, <100> structure was found in that pole figure, and it was confirmed that the mean grain size was 0.4 mm by area mean method of etched surface. The residual 200 mm of the 210 mm long sample was lathed into a sample rod with a diameter of 10 mm and a length of 200 mm. The sample rod was annealed at 250° C. for 2 hours and residual stress on the surface of the sample rod caused by lathing was removed. Further, the sample was soaked with jigs into liquid helium, and its electric resistivity was measured at 4.2° K. of ultra low temperature by the eddy current decay method.

In addition, the above 200 mm sample was given with 0.1% cyclic tensile strain and compressive strain by 3,000 times with the temperature kept at 4.2° K. and, thereafter its electric resistivity was measured in the liquid helium by the eddy current decay method in the same manner as mentioned in the just above paragraph. The results are shown in Table 1.

EXAMPLE 2:

The same procedures as shown in EXAMPLE 1 were taken except that the purity was 99.9995 weight % instead of 99.999 weight % and the recrystallization heat treatment at 300° C. for 60 minutes instead of at 450° C. for 10 minutes. The results are shown in Table 1.

TABLE 1

Measurements on Polycrystalline Specimens

| | Heat-treatment (°C.) (minute) | Mean grain size (mm) | Electric resistivity | |
|---|---|---|---|---|
| | | | Before strain (nΩcm) | After 3000 cycles of strain (nΩcm) |
| INVENTION EXAMPLE 1 | 450 10 | 0.4 | 0.6 | 4.3 |
| INVENTION EXAMPLE 2 | 300 60 | 0.1 | 0.6 | 3.3 |
| COMPARATIVE EXAMPLE | 300 60 | 0.4 | 0.58 | 9.70 |

*This data is derived from the report of International Conference on Cryogenic Materials, Applications and Properties, Shenyang, People's Republic of China, June 7–10, 1988 (Table 3).

EXAMPLE 3:

A substantially single crystal rod of high purity aluminum with purity of 99.999 weight % with a diameter of 20 mm and a length of 250 mm was produced by the Chalmers method so as to have its crystal axis <100> in the longitudinal direction of the rod.

The rod was cut and lathed into a sample rod with a diameter of 10 mm and a length of 200 mm. The sample rod was annealed at 200° C. for 2 hours and residual stress on the surface of the sample rod caused by cutting and lathing was removed.

By etching the single crystal sample rod, it was confirmed that this heat treatment did not cause new re-crystallized grains to emerge on the surface of the rod.

The sample rod was soaked with jigs into liquid helium and its electric resistivity was measured at 4.2° K. of ultra low temperature by the eddy current decay method.

In addition, the sample rod was given with 0.1% tensile strain and compressive strain to electric resistivity saturation (500 cycles of cyclic strain) with the temperature kept at 4.2° K., thereafter its electric resistivity was measured in the liquid helium in the same manner as mentioned in the just above paragraph. The results are shown in Table 2.

EXAMPLE 4:

The same procedures as shown in EXAMPLE 3 were taken except that the crystal axis <111>, instead of <100>, was oriented to the longitudinal direction of the rod. The results are shown in Table 2.

EXAMPLE 5:

The same procedures as shown in EXAMPLE 3 were taken except that the crystal axis deviating from <100> by 6°, instead of <100>, was oriented to the longitudinal direction of the rod. The results are shown in Table 2.

EXAMPLE 6:

The same procedures as shown in EXAMPLE 3 were taken except that the crystal axis deviating from <111> by 6°, instead of <100>, was oriented to the longitudinal direction of the rod. The results are shown in Table 2.

COMPARATIVE EXAMPLE 2:

The same procedures as shown in EXAMPLE 3 were taken except that the crystal axis <110>, instead of <100>, and that 3,000 cycles of cyclic strains are given, instead of 500 cycles, was oriented to the longitudinal direction of the rod. The results are shown in Table 2.

COMPARATIVE EXAMPLE 3:

The same procedures as shown in EXAMPLE 3 were taken except that the crystal axis deviating from <110> by 6°, instead of <100>, and that 3,000 cycles of cyclic strains are given, instead of 500 cycles, was oriented to the longitudinal direction of the rod. The results are shown in Table 2.

COMPARATIVE EXAMPLE 4:

The same procedures as shown in EXAMPLE 3 were taken except that the crystal axis deviating from <100> by 15°, instead of <100>, and that 3,000 cycles of cyclic strains are given, instead of 500 cycles, was oriented to the longitudinal direction of the rod. The results are shown in Table 2.

COMPARATIVE EXAMPLE 5:

The same procedures as shown in EXAMPLE 3 were taken except that the crystal axis deviating from <111> by 15°, instead of <100>, and that 3,000 cycles of cyclic strains are given, instead of 500 cycles, was oriented to the longitudinal direction of the rod. The results are shown in Table 2.

TABLE 2

| Conductor | crystal orientation | Electric resistivity (4.2° K.) | |
|---|---|---|---|
| | | Before strain (nΩcm) | At saturation (nΩcm) |
| INVENTION EXAMPLE | | | |
| 3 | 100 | 0.14 | 1.90 |
| 4 | 111 | 0.13 | 1.68 |
| 5 | deviating from 100 by 6° | 0.14 | 5.11 |
| 6 | deviating from 111 by 6° | 0.14 | 5.81 |
| COMPARATIVE EXAMPLE | | | |
| 2 | 110 | 0.16 | 9.47 |
| 3 | deviating from 110 by 6° | 0.17 | 13.70 |
| 4 | deviating | 0.14 | 9.69 |

TABLE 2-continued

| Conductor | crystal orientation | Electric resistivity (4.2° K.) | |
|---|---|---|---|
| | | Before strain (nΩcm) | At saturation (nΩcm) |
| | from 100 by 15° | | |
| 5 | deviating from 111 by 15° | 0.19 | 11.30 |

What is claimed is:

1. A high purity aluminum conductor of a cryostatic stabilizer used at an ultra low temperature of 30° K. or lower which is provided on and around a superconductor, consisting essentially of 99.99 to 99.9999 weight percent aluminum, wherein the aluminum conductor has a polycrystal structure consisting of crystal grains wherein most of said grains have a specific crystal axis of <100>, <111> or both of <100> and <111>, each of which is essentially oriented to the longitudinal direction of the aluminum conductor.

2. A high purity aluminum conductor according to claim 1, wherein most of the crystal grains have a specific crystal axis of <100> or <111> or an axis within an angle range of not greater than 10° in relation to any one <100> and <111> axis, respectively, in the longitudinal direction of the aluminum conductor.

3. A high purity aluminum conductor according to claim 2, wherein most of the crystal grains have the mean grain size of between 0.01 mm and 3.0 mm.

4. A high purity aluminum conductor according to claim 1, wherein most of the crystal grains have a specific crystal axis of <100> in the longitudinal direction of the aluminum conductor.

5. A high purity aluminum conductor according to claim 1, wherein most of the crystal grains have a specific crystal axis of <111> in the longitudinal direction of the aluminum conductor.

6. A high purity aluminum conductor according to claim 1, wherein most of the crystal grains have a specific crystal axis of both of <100> and <111> in the longitudinal direction of the aluminum conductor.

7. A high purity aluminum conductor of a cryostatic stabilizer used at an ultra low temperature of 30° K. or lower which is provided on and around a superconductor, said high purity aluminum conductor consisting essentially of 99.995 to 99.9999 weight percent aluminum, wherein the aluminum conductor has a polycrystal structure consisting of crystal grains wherein most of said grains have a specific crystal axis of <100>, <111> or an axis within an angle range of not greater than 10° in relation to any one <100> and <111> axis, respectively, in the longitudinal direction of the aluminum conductor, and wherein the mean crystal grain size is 0.01 mm to 2.0 mm.

8. A high purity aluminum conductor of a cryostatic stabilizer used at an ultra low temperature of 30° K. or lower which is provided on and around a superconductor, consisting essentially of 99.99 to 99.9999 weight percent aluminum, wherein the aluminum conductor has a single crystal structure having a specific crystal axis of <100> or <111> each of which is essentially orientated to the longitudinal direction of the aluminum conductor.

9. A high purity aluminum conductor of a cryostatic stabilizer used at an ultra low temperature of 30° K. or lower which is provided on and around a superconductor, said high purity aluminum conductor consisting essentially of 99.99 to 99.9999 weight percent aluminum, wherein said high purity aluminum conductor consists of a veritable single crystal or a substantially single crystal, wherein the crystal has a specific crystal axis of <100>, <111> or an axis within an angle range of not greater than 10° in relation to any one of <100> and <111> axes, respectively, in the longitudinal direction of the aluminum conductor.

* * * * *